(12) United States Patent
Zou

(10) Patent No.: US 11,798,612 B2
(45) Date of Patent: Oct. 24, 2023

(54) DATA REFRESHING METHOD OF MEMORY, CONTROLLER OF MEMORY, AND MEMORY

(71) Applicant: CHANGXIN MEMORY TECHNOLOGIES, INC., Hefei (CN)

(72) Inventor: Wu Zou, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 190 days.

(21) Appl. No.: 17/395,613

(22) Filed: Aug. 6, 2021

(65) Prior Publication Data
US 2022/0093167 A1 Mar. 24, 2022

Related U.S. Application Data

(63) Continuation of application No. PCT/CN2021/098836, filed on Jun. 8, 2021.

(30) Foreign Application Priority Data

Sep. 22, 2020 (CN) .......................... 202011002960.3

(51) Int. Cl.
*G11C 11/00* (2006.01)
*G11C 11/406* (2006.01)

(52) U.S. Cl.
CPC .............................. *G11C 11/40618* (2013.01)

(58) Field of Classification Search
CPC ............. G11C 11/40611; G11C 11/406; G11C 11/40622; G11C 11/40618;
(Continued)

(56) References Cited

U.S. PATENT DOCUMENTS

2002/0080674 A1 6/2002 Dobler
2005/0099868 A1 5/2005 Oh
(Continued)

FOREIGN PATENT DOCUMENTS

CN 1879173 A 12/2006
CN 103810126 A 5/2014
(Continued)

OTHER PUBLICATIONS

International Search Report in the international application No. PCT/CN2021/098836, dated Sep. 8, 2021, 2 pgs.
(Continued)

*Primary Examiner* — Thong Q Le
(74) *Attorney, Agent, or Firm* — Cooper Legal Group, LLC

(57) ABSTRACT

The disclosure provides a data refreshing method of a memory, a controller of a memory, and a memory. The method includes that a target refreshing row in a data row of the memory is determined according to a running state of the controller, the target refreshing row including at least one data row; and in response to determining that a first refreshing interval expires and the target refreshing row includes a first reserved row, the first reserved row in the target refreshing row is refreshed. The first reserved row is a data row with data storage duration smaller than preset duration in the memory. The first refreshing interval is a refreshing interval of the first reserved row.

18 Claims, 9 Drawing Sheets

A target refreshing row in a data row of the memory is determined according to a running state of the controller. The target refreshing row includes at least one data row — S201

If a first refreshing interval expires and the target refreshing row includes a first reserved row, the first reserved row in the target refreshing row is refreshed; the first reserved row is a data row with data storage duration smaller than preset duration in the memory; the first refreshing interval is a refreshing interval of the first reserved row — S202

(58) Field of Classification Search
CPC .......... G11C 11/40603; G11C 11/4087; G11C 11/4078; G11C 11/408; G11C 11/40615; G11C 11/4076; G11C 11/4091; G11C 7/24; G11C 11/4085; G11C 29/50; G11C 29/50012; G11C 2211/4065; G11C 2029/0409; G11C 11/40626; G11C 11/4063; G11C 29/789; G11C 11/40607; G11C 2029/0403; G11C 29/025; G11C 29/06; G11C 7/1072; G11C 11/4072; G11C 7/02; G11C 11/4096; G11C 29/44; G11C 29/52; G11C 11/4094; G11C 16/3418; G11C 2211/4068; G11C 29/42; G11C 5/04; G11C 7/1084; G11C 7/12; G11C 8/08; G11C 11/409; G11C 11/4093; G11C 2029/0411; G11C 2029/1202; G11C 29/18; G11C 29/76; G11C 5/025; G11C 8/04; G11C 11/1655; G11C 11/1657; G11C 11/1675; G11C 11/1677; G11C 11/1693; G11C 11/401; G11C 16/08; G11C 16/105; G11C 16/14; G11C 16/3436; G11C 2211/4061; G11C 29/023; G11C 29/028; G11C 29/10; G11C 29/20; G11C 29/4401; G11C 29/50016; G11C 29/783; G11C 5/02; G11C 5/063; G11C 7/08; G11C 7/1006

See application file for complete search history.

(56) References Cited

U.S. PATENT DOCUMENTS

| | | |
|---|---|---|
| 2014/0016422 A1 | 1/2014 | Kim |
| 2014/0189215 A1 | 7/2014 | Kang |
| 2019/0043558 A1 | 2/2019 | Suh et al. |
| 2019/0221252 A1 | 7/2019 | Suh et al. |
| 2019/0324689 A1* | 10/2019 | Choi .................... G06F 3/0653 |
| 2020/0321051 A1 | 10/2020 | Suh et al. |

FOREIGN PATENT DOCUMENTS

| | | |
|---|---|---|
| CN | 103811048 A | 5/2014 |
| CN | 103688311 B | 10/2017 |
| CN | 110945589 A | 3/2020 |

OTHER PUBLICATIONS

Supplementary European Search Report in the European application No. 21769324.1, dated Apr. 28, 2022, 9 pgs.

* cited by examiner

| A fourth data row (Row 4) |
|---|
| A third data row (Row 3) |
| A second data row (Row 2) |
| A first data row (Row 1) |

FIG. 4

| | | Sixteenth data row |
|---|---|---|
| Skip, do not refresh (1x refreshing mode) | Refresh a timing value of a twelfth row ↑ Refresh a timing value of an eleventh row | Fifteenth data row |
| | | Fourteenth data row |
| | | Thirteenth data row |
| Refresh (2x refreshing mode) | Refresh a timing value of a tenth row | Twelfth data row |
| | Refresh a timing value of a ninth row | Eleventh data row (First reserved row) |
| Skip, do not refresh (2x refreshing mode) | Refresh a timing value of an eighth row | Tenth data row |
| | Refresh a timing value of a seventh row | Ninth data row |
| Skip, do not refresh (1x refreshing mode) | Refresh a timing value of a sixth row ↑ Refresh a timing value of a fifth row | Eighth data row |
| | | Seventh data row |
| | | Sixth data row |
| | | Fifth data row |
| Skip, do not refresh (2x refreshing mode) | Refresh a timing value of a fourth row | Fourth data row |
| | Refresh a timing value of a third row | Third data row |
| Refresh (2x refreshing mode) | Refresh a timing value of a second row | Second data row |
| | Refresh a timing value of a first row | First data row (First reserved row) |

FIG. 5

DATA REFRESHING METHOD OF MEMORY, CONTROLLER OF MEMORY, AND MEMORY

CROSS-REFERENCE TO RELATED APPLICATION

This application is a continuation of International patent application No. PCT/CN2021/098836, filed on Jun. 8, 2021, which is filed based upon and claims priority to Chinese patent application No. 202011002960.3, filed on Sep. 22, 2020. The contents of International patent application No. PCT/CN2021/098836 and Chinese patent application No. 202011002960.3 are incorporated herein by reference in their entireties.

TECHNICAL FIELD

The disclosure relates to the technology of a memories, and in particular to a data refreshing method of a memory, a controller of a memory, and a memory.

BACKGROUND

As a semiconductor memory, a dynamic random access memory (DRAM for short) is widely used in various electronic products because of its high efficiency and low cost. The DRAM is composed of a transistor and a capacitor, and a basic storage unit of each DRAM stores data depending on the electric quantity of the capacitor. When an external apparatus reads the data in the DRAM, the data stored in the DRAM is identified by sensing the electric quantity of the capacitor in the DRAM. Since the capacitor may leak electricity through the transistor, the electric quantity of the capacitor may be gradually reduced, and if the capacitor is not charged in time, a storage error of the data in the DRAM may be caused. Therefore, in order to ensure the accuracy of the data in the DRAM, the basic storage unit of the DRAM needs to be periodically charged, which is called DRAM refreshing. The DRAM refreshing may maintain the correctness of the data in the DRAM.

However, there are two problems in a DRAM refreshing process. 1. Due to the limitation of the data storing time, the DRAM refreshing is executed before data access. That is, when the DRAM refreshing is performed, the data access cannot be performed until the DRAM refreshing is completed. This causes certain delay in the data access to the DRAM. 2. The data storing time of most of the basic storage units in the DRAM is greater than 64 ms. If all the basic storage units are refreshed and stored with the lowest refreshing period only because the data storing time of a very small part of the basic storage units is relatively short, a large amount of unnecessary refreshing may be caused, and this method with a high refreshing frequency results in huge energy consumption of the DRAM and further results in data access delay.

Therefore, how to solve the problems of serious energy consumption and data access delay in the DRAM refreshing process in the related art still needs to be researched.

SUMMARY

In a first aspect, the disclosure discloses a data refreshing method of a memory, which includes: determining a target refreshing row in a data row of the memory according to a running state of a controller, the target refreshing row including at least one data row; refreshing a first reserved row in the target refreshing row in response to determining that a first refreshing interval expires and the target refreshing row includes a first reserved row, the first reserved row being a data row with data storage duration smaller than preset duration in the memory, the first refreshing interval being a refreshing interval of the first reserved row.

In a second aspect, the disclosure discloses a controller of a memory. The controller is configured to control the memory to perform data refreshing and data access, and includes: a processor and a memory configured to store instructions executable by the processor. The processor is configured to: determine a target refreshing row in a data row of the memory according to a running state of the controller, the target refreshing row including at least one data row; and refresh a first reserved row in the target refreshing row in response to determining that a first refreshing interval expires and the target refreshing row includes the first reserved row. The first reserved row is a data row with data storage duration smaller than preset duration in the memory. The first refreshing interval is a refreshing interval of the first reserved row.

In a third aspect, the disclosure discloses a memory, which includes a controller and a plurality of storage units. The storage unit includes a plurality of data rows. The storage unit is configured to store data. The controller is configured to execute the method in the first aspect.

BRIEF DESCRIPTION OF THE DRAWINGS

FIG. 4 is a schematic diagram of a data row in a data refreshing method of a memory provided by an embodiment of the disclosure.

FIG. 5 is an application diagram of a data refreshing method of a memory provided by an embodiment of the disclosure.

DETAILED DESCRIPTION

Reference will now be made in detail to examples, examples of which are illustrated in the accompanying drawings. The following description refers to the accompanying drawings in which the same numbers in different drawings represent the same or similar elements unless otherwise represented. The implementations set forth in the following description of examples do not represent all implementations consistent with the present disclosure. Instead, they are merely examples of apparatuses and methods consistent with aspects related to the present disclosure as recited in the appended claims.

Figure 1:
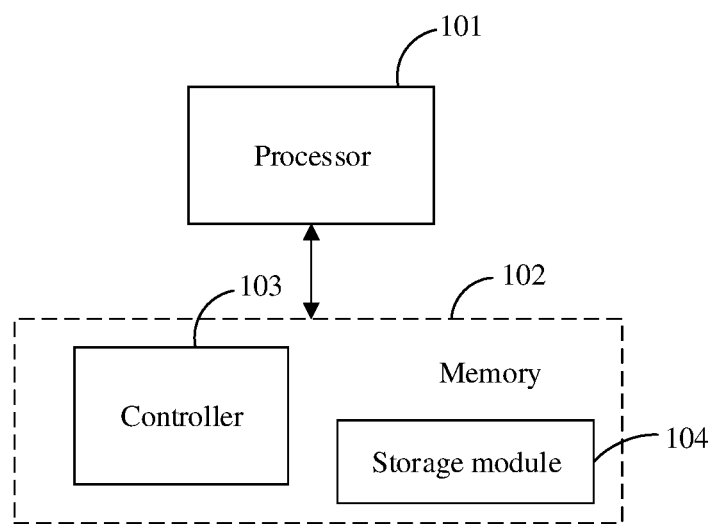
FIG. 1 is an application diagram of a data refreshing method of a memory provided by the disclosure.

A data refreshing method of a memory provided by the disclosure is applied to a computer apparatus, for example, a computer, a server, a tablet computer, a mobile phone, and the like. FIG. 1 is a structural schematic diagram of a computer apparatus. As illustrated in FIG. 1, the computer apparatus includes a processor 101 and a memory 102. The processor 101 is connected/coupled to a controller 103 and may access the memory 102 through the controller 103. The processor 101 may be a multi-core processor. The processor 101 executes programs of system software (such as an operating system and/or system firmware, for example, a basic input/output system, extensible firmware, or the like), a utility tool, an application program, and the like. The programs and data required in an execution process of the processor 101 are stored in the memory 102. The memory 102 includes the controller 103 and a storage module 104. The controller 103 is configured to control read and write of the data. The storage module 104 is configured to store the data. The storage module 104 may include one or more storage units.

A dynamic random access memory (DRAM) is a common semiconductor memory and is widely used in various electronic products due to its high efficiency and low cost. The DRAM includes a transistor and a capacitor, and a basic storage unit of each DRAM stores data depending on the electric quantity of the capacitor. When an external apparatus reads the data of the DRAM, the data stored in the DRAM is identified by sensing the electric quantity of the capacitor in the DRAM. Since the capacitor may leak electricity through the transistor, the electric quantity of the capacitor may be gradually reduced, and if the capacitor is not charged in time, a storage error of the data in the DRAM may be caused. Therefore, in order to ensure the accuracy of the data stored in the DRAM, the basic storage unit of the DRAM needs to be periodically charged, which is called DRAM refreshing. The DRAM refreshing may maintain the correctness of the data in the DRAM.

However, there are two problems in a DRAM refreshing process. 1. Due to the limitation of the data storing time, the DRAM refreshing is executed before data access. That is, when the DRAM refreshing is performed, the data access cannot be performed until the DRAM refreshing is completed. This causes certain delay in the data access to the DRAM. In particular, when it is urgent to store data into or read data from the DRAM, it is necessary to wait until the DRAM is refreshed before data access may be performed, which brings great inconvenience to data access.

2. The data storing time of most of the basic storage units in the DRAM is greater than 64 ms, and only the data storing time of a very small part of the basic storage units is relatively short. In the related art, all the basic storage units are refreshed and stored with the lowest refreshing period, that is, the basic storage unit with data storing time smaller than or equal to 64 ms, the basic storage unit with the data storing time greater than 64 ms and smaller than or equal to 128 ms, and the basic storage unit with the data storing time greater than 128 ms and smaller than or equal to 256 ms are refreshed and stored with the lowest refreshing period, for example, 64 ms. This method with a high refreshing frequency results in a large amount of unnecessary refreshing, results in huge energy consumption of the DRAM, and further results in data access delay. Therefore, how to solve the problems of serious energy consumption and data access delay in the DRAM refreshing process in the related art still needs to be researched.

Therefore, the disclosure provides a data refreshing method of a memory, a controller of a memory, and a memory. The data refreshing method of a memory is applied to the controller. The controller is configured to control the memory to perform data refreshing and data access. According to the data refreshing method of a memory, to-be-refreshed data in a to-be-refreshed data row is divided into a first reserved row, and the first reserved row refers to a data row with data storage duration smaller than preset duration in the memory. When the memory is refreshed, the first reserved row is refreshed preferentially without refreshing the whole data row, so that unnecessary refreshing is avoided, and the problem of serious energy consumption upon data refreshing in the memory is solved. In a data refreshing process, data which is not refreshed may still be accessed, and the problem of data access delay upon the data refreshing in the memory is solved.

The technical solutions of the disclosure and how the technical solutions of the disclosure solve the above technical problems will be illustrated below in detail with specific embodiments. The following specific embodiments may be combined with each other, and the same or similar concepts or processes may not be repeated in some embodiments. The embodiments of the disclosure will now be described in combination with the accompanying drawings.

Figure 2:
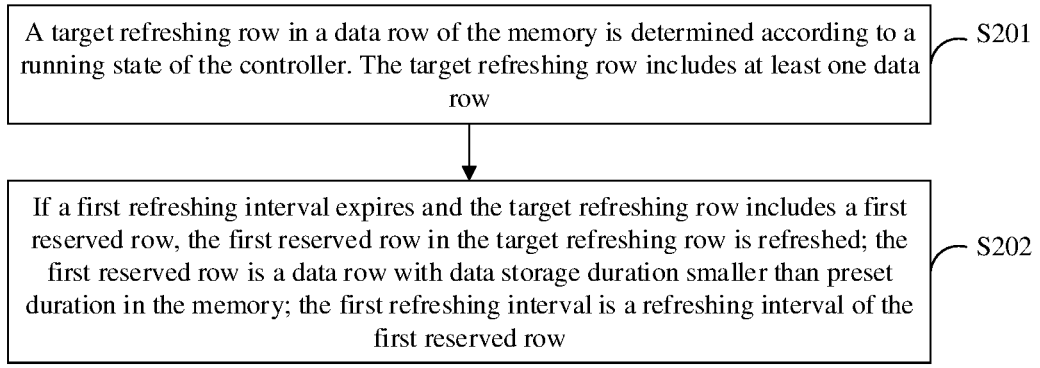
FIG. 2 is a flowchart of a data refreshing method of a memory provided by an embodiment of the disclosure.

Referring to FIG. 2, the disclosure provides a data refreshing method of a memory, applied to a controller. The controller is configured to control the memory to perform data refreshing and data access. The method includes as follows.

At S201, a target refreshing row in a data row of the memory is determined according to a running state of the controller. The target refreshing row includes at least one data row.

The controller is set in the memory. The running state of the controller may include running or non-running. The target refreshing row is a to-be-refreshed data row. Being to-be-refreshed refers to arrival of refreshing time of the data row. The target refreshing row includes at least one data row. When the target refreshing row includes more than one data row, a refreshing mode of the target refreshing row needs to be determined according to the running state of the controller. For example, the refreshing mode may include sequential refreshing of all the data rows in the memory or synchronous refreshing of data rows which need to be refreshed in all the data rows in the memory. The refreshing mode may also include, for example, grouping all the data rows in the memory and refreshing all the data rows based on the grouping.

At S202, if a first refreshing interval expires and the target refreshing row includes a first reserved row, the first reserved row in the target refreshing row is refreshed. The first reserved row is a data row with data storage duration smaller/less than preset duration in the memory. The first refreshing interval is a refreshing interval of the first reserved row.

The refreshing interval of each data row in the memory is set by a refreshing countdown timer. The refreshing countdown timer sets a first refreshing interval on each data row. The first refreshing interval is the refreshing interval of the first reserved row. That is, after the first refreshing interval expires, if the target refreshing row includes the first reserved row, the first reserved row in the target refreshing row is refreshed. At this time, the data with the storage duration smaller than the preset duration in the target refreshing row is refreshed, and the rest of the data is not refreshed and may still be read.

Whether the target refreshing row includes the first reserved row is specifically determined as follows: before a refreshing program of the memory is formally run, a worker tests and acquires the data storage duration of the data in the storage unit, and records an address row/data row of the data in the storage unit with the data storage duration smaller than the preset duration to the controller. The address row/data row with the data storage duration smaller than the preset duration belongs to the first reserved row or may be marked as the first reserved row. For example, when the preset duration is 256 ms, the address row/data row of the data in the storage unit with the data storage duration smaller than 256 ms is recorded to the controller. The address row/data row with the data storage duration smaller than 256 ms may be marked as the first reserved row. When the controller controls the memory to perform data refreshing, matching needs to be performed according to the first reserved row stored in the controller and the target refreshing row in the memory. If the matching is successful, it is determined that the target refreshing row includes the first reserved row. The matching means that the controller determines whether the data row belonging to the first reserved row exists in the target refreshing row.

According to the data refreshing method of a memory provided by the embodiment, after the target refreshing row is determined, if a first refreshing interval of the target refreshing row expires and the target refreshing row includes the first reserved row, the first reserved row in the target refreshing row is refreshed. At this time, since only the data with the data storage duration smaller than the preset duration in the target refreshing row is refreshed, while the data with the data storage duration greater than or equal to the preset duration is not refreshed. The data with the data storage duration greater than or equal to the preset duration may still be read, and the problem of data access delay in a DRAM refreshing process in the related art is solved. In addition, when the data row in the memory needs to be refreshed, only the data row with the data storage duration smaller than the preset duration in the data row is refreshed, the data row is not completely refreshed, the energy consumption in the DRAM refreshing process is low, and the problem of serious energy consumption in the DRAM refreshing process in the related art is solved.

In an embodiment of the disclosure, operation S201 includes as follows.

If the running state of the controller is non-running, a data row with arrived corresponding refreshing time in all the data rows of the memory is determined to be the target refreshing row. The non-running means that the controller does not need to access the data in the memory. When the controller is non-running, all the data rows in the memory need to be processed.

If the corresponding refreshing time of one data row in all the data rows arrives, the one data row is locked as the target refreshing row. The corresponding refreshing time of a plurality of data rows in all the data rows may arrive at the same time, if the corresponding refreshing time of at least two data rows in all the data rows arrives, the at least two data rows are locked as the target refreshing row. For example, all the data rows of the memory may include four data rows in total. For the sake of illustration, the four data rows are named here as a first data row, a second data row, a third data row, and a fourth data row, respectively. If the refreshing time of the first data row arrives and the refreshing time of the second data row, the third data row and the fourth data row does not arrive, the first data row is the target refreshing row. If the refreshing time of the first data row and the third data row arrives and the refreshing time of the second data row and the fourth data row does not arrive, the first data row and the third data row are the target refreshing row.

Figure 3:
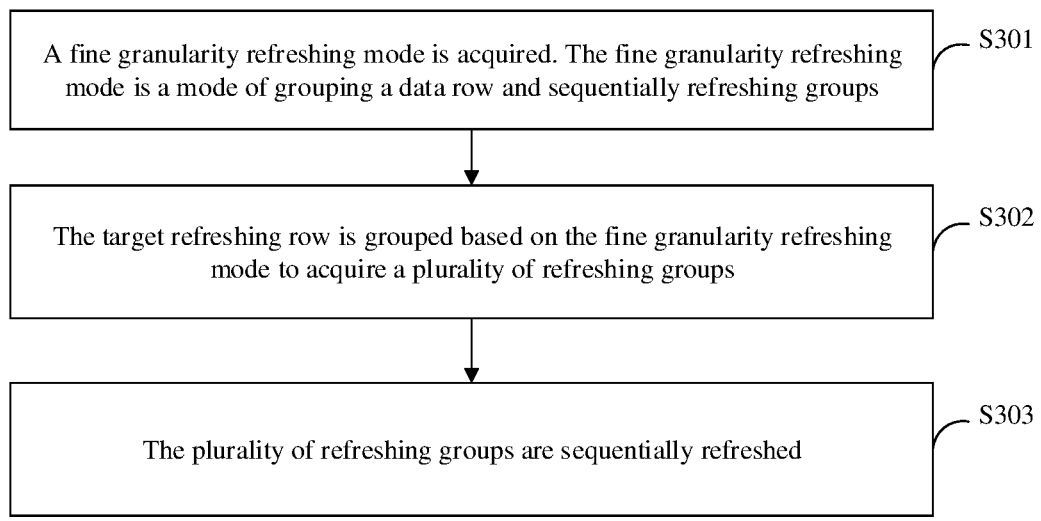
FIG. 3 is a flowchart of a data refreshing method of a memory provided by an embodiment of the disclosure.

Referring to FIG. 3, in an embodiment of the disclosure, the data refreshing method of a memory further includes as follows.

At S301, a fine granularity refreshing mode is acquired. The fine granularity refreshing mode is a mode of grouping the data row and sequentially refreshing groups.

When the running state of the controller is non-running, the fine granularity refreshing mode is acquired. In the fine granularity refreshing mode, the memory may, in response to a single refreshing command, refresh the data in the memory in 1× mode, 2× mode, and 4× mode, respectively. Specifically, the controller may respond to the refreshing command. The controller may control the memory to perform data refreshing in the 1× mode, the data refreshing in the 2× mode, or the data refreshing in the 4× mode upon the data refreshing.

The operation that the first reserved row in the target refreshing row is refreshed includes as follows.

At S302, the target refreshing row is grouped based on the fine granularity refreshing mode to acquire a plurality of refreshing groups.

As illustrated in FIG. 4, the target data row includes four rows in total. When the four data rows are refreshed in the 1× mode, the four data rows are refreshed as one refreshing group, that is, the first data row, the second data row, the third data row and the fourth data row are refreshed as one refreshing group. When the four data rows are refreshed in the 2× mode, the four data rows are divided into two groups, each group includes two data rows, and then the four data rows are sequentially refreshed in groups, that is, the first data row and the second data row are refreshed as one refreshing group, and the third data row and the fourth data row are refreshed as one refreshing group. When the four data rows are refreshed in the 4× mode, the four data rows are divided into four groups, each group includes one data row, and then the four data rows are sequentially refreshed in groups, that is, the first data row is refreshed as one refreshing group, the second data row is refreshed as one refreshing group, the third data row is refreshed as one refreshing group, and the fourth data row is refreshed as one refreshing group.

At S303, the plurality of refreshing groups are sequentially refreshed.

Each refreshing group may include the first reserved row and may also include no first reserved row. If one refreshing group includes the first reserved row, the one refreshing group needs to be refreshed. If another refreshing group does not include the first reserved row, the another refreshing group does not need to be refreshed. After the another refreshing group is marked as processed, the next refreshing group is processed. For example, in FIG. 4, when the four data rows are refreshed in the 4× mode, if the first data row includes the first reserved row, the first data row is refreshed. If the second data row does not include the first reserved row, the second data row does not need to be refreshed, and the third data row is processed. As further shown in FIG. 5, if the target data row includes 16 rows: a first data row, a second data row, a third data row, a fourth data row, a fifth data row, . . . a fifteenth data row, and a sixteenth data row in sequence. When the 16 rows of data are refreshed, the 16 rows of data may be sequentially refreshed in the 1× mode and the 2× mode, respectively. As illustrated in FIG. 5, the first data row, the second data row, the third data row, and the fourth data row are refreshed in the 2× mode. If the first data row includes the first reserved row, the first data row and the second data row are refreshed. If the third data row and the fourth data row do not include the first reserved row, the refreshing group including the third data row and the fourth data row is not refreshed, that is, the refreshing group is skipped and is not refreshed. The fifth data row, the sixth data row, the seventh data row, and the eighth data row are taken as one refreshing group and are refreshed in the 1× mode. At this time, if the fifth data row, the sixth data row, the seventh data row, and the eighth data row do not include the first reserved row, the refreshing group including the fifth data row, the sixth data row, the seventh data row and the eighth data row is not refreshed. The ninth data row and the tenth data row are processed next, the ninth data row and the tenth data row are taken as one refreshing group and are refreshed in the 2× mode. If the ninth data row and the tenth data row do not include the first reserved row, the ninth data row and the tenth data row are not refreshed. The eleventh data row and the twelfth data row are processed next, the eleventh data row, and the twelfth data row are taken as one refreshing group and are refreshed in the 2× mode. If the eleventh data row and the twelfth data row include the first reserved row, and the one refreshing group including the eleventh data row and the twelfth data row is refreshed. The thirteenth data row, the fourteenth data row, the fifteenth data row, and the sixteenth data row are taken as one refreshing group and are refreshed in the 1× mode. If the fourteenth data row and the sixteenth data row include the first reserved row, the one refreshing group including the thirteenth data row, the fourteenth data row, the fifteenth data row and the sixteenth data row is refreshed.

Each refreshing group is provided with the first refreshing interval, after the first refreshing interval expires, whether the refreshing group includes the first reserved row needs to be determined, and if so, the data row in the refreshing group is refreshed.

According to the method provided by the embodiment, the target data row is grouped based on the fine granularity refreshing mode to acquire the plurality of refreshing groups, and then the plurality of refreshing groups are sequentially refreshed. At this time, the refreshing group which does not include the first reserved row will not be refreshed, and therefore refreshing consumption of the memory will not be caused. The data row of the refreshing group including the first reserved row will be refreshed according to the method of refreshing the first reserved row, so that the refreshing consumption of the memory also will not be caused. In addition, when the data refreshing of the memory is performed by adopting the method at S202 based on the fine granularity refreshing mode, since the refreshing is performed in groups, the data access to the memory may still be executed, and the problem of data access delay in the data refreshing process of the memory is avoided.

The method provided by the embodiment can solve the problem of excessive loss of the memory in data refresh.

In an embodiment of the disclosure, operation S201 includes as follows.

If the running state of the controller is running, a data row with arrived refreshing time in part of the data rows of the memory is determined to be the target refreshing row. The running means that the controller needs to access the data in the memory.

The part of the data rows are randomly selected data rows. When the controller is running, the part of the data rows in the memory need to be processed. If the corresponding refreshing time of one data row in the part of the data rows arrives, the one data row is locked as the target refreshing row. The corresponding refreshing time of a plurality of data rows in the part of the data rows may arrive at the same time, if the corresponding refreshing time of at least two data rows in the part of the data rows arrives, the at least two data rows are locked as the target refreshing row.

Figure 6:
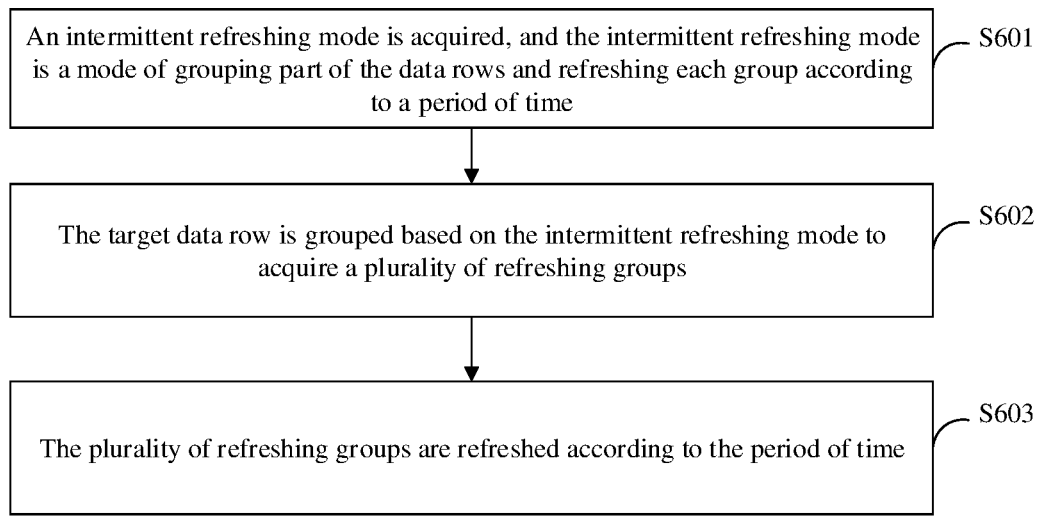
FIG. 6 is a flowchart of a data refreshing method of a memory provided by another embodiment of the disclosure.

Referring to FIG. 6, in an embodiment of the disclosure, the data refreshing method of a memory further includes as follows.

At S601, an intermittent refreshing mode is acquired. The intermittent refreshing mode is a mode of grouping part of the data rows and refreshing each group according to a period of time.

Figure 7:
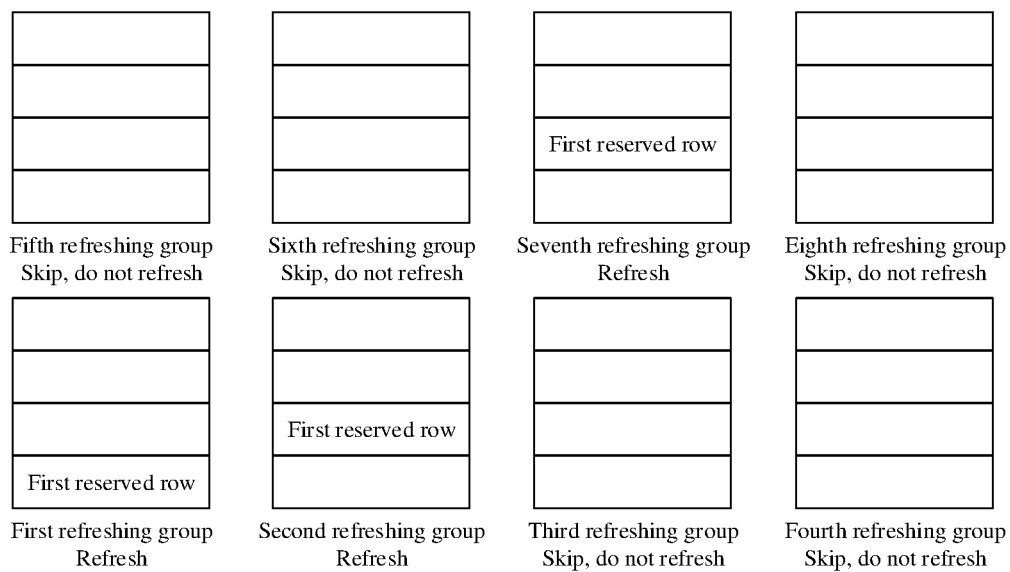
FIG. 7 is an application diagram of a data refreshing method of a memory provided by another embodiment of the disclosure.

As illustrated in FIG. 7, part of the data rows in the memory are divided into eight refreshing groups: a first refreshing group, a second refreshing group, a third refreshing group, a fourth refreshing group, a fifth refreshing group, a sixth refreshing group, a seventh refreshing group and an eighth refreshing group in sequence. When the eight refreshing groups are refreshed, those groups do not need to be refreshed sequentially. As illustrated in FIG. 7, the first refreshing group, the second refreshing group, and the seventh refreshing group are randomly selected as the target refreshing rows, and the first refreshing group, the second refreshing group, and the seventh refreshing group are refreshed according to the period of time.

The operation that the first reserved row in the target refreshing row is refreshed includes as follows.

At S602, the target data row is grouped based on the intermittent refreshing mode to acquire a plurality of refreshing groups.

As described above, part of the data rows in the memory are divided into the eight refreshing groups: the first refreshing group, the second refreshing group, the third refreshing group, the fourth refreshing group, the fifth refreshing group, the sixth refreshing group, the seventh refreshing group and the eighth refreshing group in sequence.

At S603, the plurality of refreshing groups are refreshed according to the period of time.

The refreshing according to the period of time may perform the data access to the memory when the refreshing group is not refreshed or when the refreshing group is refreshed, so that the data access delay will not be caused. When the refreshing is performed according to the period of time based on operation S202, energy consumption of the memory upon the data refreshing will be reduced.

In an embodiment of the disclosure, the data refreshing method of a memory further includes as follows.

If a second refreshing interval expires, a second reserved row is refreshed. The second reserved row is a data row with data storage duration greater than or equal to preset duration in the memory. The second refreshing interval is a refreshing interval of the second reserved row.

The preset duration may be set according to an actual requirement of the memory, for example, the preset duration may be set as 64 ms, or 128 ms, or 256 ms. For example, if the preset duration is 64 ms, the data row with the data storage duration greater than or equal to 64 ms in the memory is the second reserved row. If the preset duration is 256 ms, the data row with the data storage duration greater than or equal to 256 ms in the memory is the second reserved row. When the first reserved row and the second reserved row exist at the same time, if the first refreshing interval expires, the first reserved row is refreshed first; and when the second refreshing interval expires, the second reserved row is refreshed. For example, when the refreshing is performed based on the fine granularity refreshing mode, the first reserved row in the refreshing group is refreshed first when the first refreshing interval in the refreshing group expires, and after the second refreshing interval in the refreshing group expires, the second reserved row in the refreshing group is refreshed, thereby finishing refreshing the refreshing group.

In an embodiment of the disclosure, the data refreshing method of a memory further includes as follows.

If the first refreshing interval and the second refreshing interval expire at the same time, the first reserved row and the second reserved row are refreshed at the same time. The second reserved row is the data row with the data storage duration greater than or equal to the preset duration in the memory. The second refreshing interval is the refreshing interval of the second reserved row.

In the embodiment, if the first refreshing interval and the second refreshing interval expire at the same time, the first reserved row and the second reserved row are refreshed at the same time. The embodiment is suitable for the case that the first refreshing interval and the second refreshing interval expire at the same time; and if the first refreshing interval and the second refreshing interval do not expire at the same time, the first reserved row is preferentially refreshed when the first refreshing interval expires.

In an embodiment of the disclosure, the data refreshing method of a memory further includes as follows.

If the target refreshing row does not include the first reserved row and the second refreshing interval expires, the second reserved row is refreshed. The second reserved row is the data row with the data storage duration greater than or equal to the preset duration in the memory. The second refreshing interval is the refreshing interval of the second reserved row.

If the target refreshing row does not include the first reserved row, the second reserved row is refreshed after the second refreshing interval expires. It is to be noted that no matter the data refreshing is performed based on the fine granularity refreshing mode or the data refreshing is performed based on the intermittent refreshing mode, the target data row including the first reserved row is refreshed first. After all the target data rows including the first reserved rows are refreshed, the refreshing group which does not include the first reserved row is refreshed. At this time, the second reserved row is refreshed on the basis that the second refreshing interval expires, that is, the refreshing group itself which does not include the first reserved row is refreshed. For example, as illustrated in FIG. 5, when the data refreshing is performed in the fine granularity refreshing mode, if the refreshing group including the first data row and the second data row includes the first reserved row, the refreshing group in which the first data row and the second data row are located is refreshed according to operation S202. After all the refreshing groups including the first reserved row in the 16 data rows are refreshed, the refreshing group which does not include the first reserved row and only includes the second reserved row is refreshed. At this time, the second reserved row is refreshed according to expiration time of the second refreshing interval.

In an embodiment of the disclosure, the memory includes a refreshing timer. The refreshing timer is configured to identify whether each data row has been processed.

The refreshing timer is set on the memory. The refreshing timer may mark a timing value on each data row. If the data row has been processed, no matter the data row is refreshed, the timing value on the data row will be increased to identify that the data row has been processed. The processing means whether the data row includes the first reserved row is determined first, and if so, the data row is refreshed after the first refreshing interval expires. If the data row does not include the first reserved row and only includes the second reserved row, the processing means whether the data row includes the first reserved row is determined, but the data row is not refreshed. At this time, the timing value of the data row is increased to identify that the data row has been processed.

Figure 8:
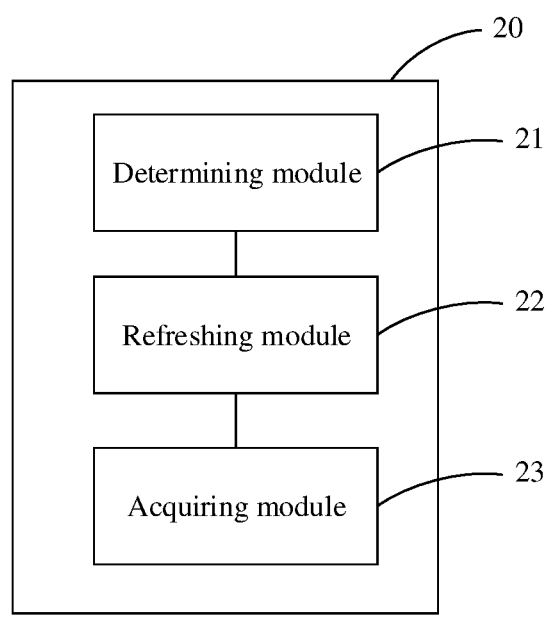
FIG. 8 is a schematic diagram of a controller of a memory provided by an embodiment of the disclosure.

Referring to FIG. 8, in an exemplary embodiment, the disclosure further provides a controller 20 of a memory 10. The controller 20 is configured to control the memory to perform data refreshing and data access. The method includes a determining module 21 and a refreshing module 22.

The determining module 21 is configured to determine a target refreshing row in a data row of the memory according to a running state of the controller. The target refreshing row includes at least one data row.

The refreshing module 22 is configured to refresh a first reserved row in the target refreshing row if a first refreshing interval expires and the target refreshing row includes the first reserved row. The first reserved row is a data row with data storage duration smaller than preset duration in the memory. The first refreshing interval is a refreshing interval of the first reserved row.

The determining module 21 is specifically configured to determine a data row with arrived corresponding refreshing time in all the data rows of the memory to be the target refreshing row if the running state of the controller is non-running.

The controller 20 further includes an acquiring module 23.

The acquiring module 23 is configured to acquire a fine granularity refreshing mode. The fine granularity refreshing mode is a mode of grouping the data row and sequentially refreshing groups.

The refreshing module 22 is specifically configured to group the target data row based on the fine granularity refreshing mode to acquire a plurality of refreshing groups and sequentially refresh the plurality of refreshing groups.

The determining module 21 is specifically configured to determine a data row with arrived refreshing time in part of the data rows of the memory to be the target refreshing row if the running state of the controller is running.

The acquiring module 23 is further configured to acquire an intermittent refreshing mode. The intermittent refreshing mode is a mode of grouping part of the data rows and refreshing each group according to a period of time.

The refreshing module 22 is specifically configured to group the target data row based on the intermittent refreshing mode to acquire a plurality of refreshing groups and refresh the plurality of refreshing groups according to the period of time.

The refreshing module 22 is further configured to refresh a second reserved row if a second refreshing interval expires. The second reserved row is a data row with the data storage duration greater than or equal to the preset duration in the memory. The second refreshing interval is a refreshing interval of the second reserved row.

The refreshing module 22 is further configured to refresh the first reserved row and a second reserved row at the same time if the first refreshing interval and a second refreshing interval expire at the same time. The second reserved row is a data row with the data storage duration greater than or equal to the preset duration in the memory. The second refreshing interval is a refreshing interval of the second reserved row.

The refreshing module 22 is further configured to refresh a second reserved row if the target refreshing row does not include the first reserved row and a second refreshing interval expires. The second reserved row is a data row with the data storage duration greater than or equal to the preset duration in the memory. The second refreshing interval is a refreshing interval of the second reserved row.

The memory 10 includes a refreshing timer. The refreshing timer is configured to identify whether each data row has been processed.

Figure 9:
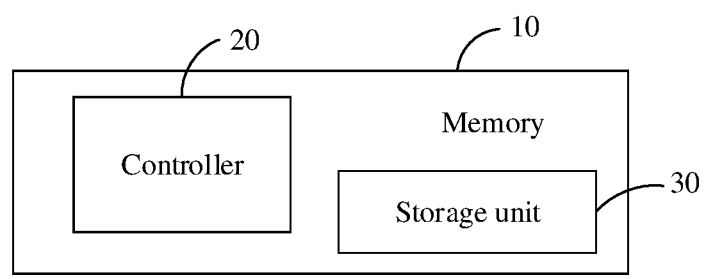
FIG. 9 is a schematic diagram of a memory provided by an embodiment of the disclosure.

Referring to FIG. 9, in the exemplary embodiment, the disclosure further provides a memory 10, including a controller 20 and a plurality of storage units 30. The storage unit 30 includes a plurality of data rows. The storage unit 30 is configured to store data. The controller 20 is configured to execute the above data refreshing method of a memory.

Other embodiments of the disclosure will be apparent to those skilled in the art after consideration of the specification and practice of the disclosure disclosed here. The disclosure is intended to cover any variations, uses, or adaptations of the disclosure, and the variations, uses, or adaptations follow the general principles of the disclosure and include common general knowledge or conventional technical means in the art undisclosed by the disclosure. The specification and embodiments are considered as examples only, and a true scope and spirit of the disclosure are indicated by the following claims.

It will be appreciated that the disclosure is not limited to the exact construction that has been described above and illustrated in the accompanying drawings, and that various modifications and changes can be made without departing from the scope thereof. The scope of the disclosure is only limited by the appended claims.

The invention claimed is:

1. A data refreshing method of a memory, applied to a controller which is configured to control the memory to perform data refreshing and data access, and comprising:
   determining a target refreshing row in a data row of the memory according to a running state of the controller; wherein the target refreshing row comprises at least one data row; and
   refreshing a first reserved row in the target refreshing row in response to determining that a first refreshing interval expires and the target refreshing row comprises the first reserved row; wherein the first reserved row is a data row with data storage duration smaller than a preset duration in the memory, and the first refreshing interval is a refreshing interval of the first reserved row;
   wherein the memory comprises a refreshing timer, which is configured to identify whether each data row has been processed.

2. The method of claim 1, wherein determining the target refreshing row in the data row of the memory according to the running state of the controller comprises:
   determining a data row with arrived corresponding refreshing time in all the data rows of the memory to be the target refreshing row in response to determining that the running state of the controller is non-running.

3. The method of claim 2, further comprising:
   acquiring a fine granularity refreshing mode; wherein the fine granularity refreshing mode is a mode of grouping the data rows and sequentially refreshing groups; and
   wherein refreshing the first reserved row in the target refreshing row comprises:
      grouping the target refreshing row based on the fine granularity refreshing mode to acquire a plurality of refreshing groups; and
      sequentially refreshing the plurality of refreshing groups.

4. The method of claim 1, wherein determining the target refreshing row in the data row of the memory according to the running state of the controller comprises:
   determining a data row with arrived refreshing time in part of the data rows of the memory to be the target refreshing row in response to determining that the running state of the controller is running.

5. The method of claim 4, further comprising:
   acquiring an intermittent refreshing mode; wherein the intermittent refreshing mode is a mode of grouping part of the data rows and refreshing each group according to a period of time;
   wherein refreshing the first reserved row in the target refreshing row comprises:
      grouping the target refreshing row based on the intermittent refreshing mode to acquire a plurality of refreshing groups; and
      refreshing the plurality of refreshing groups according to the period of time.

6. The method of claim 1, further comprising:
   refreshing a second reserved row in response to determining that a second refreshing interval expires; wherein the second reserved row is a data row with the data storage duration greater than or equal to the preset duration in the memory, and the second refreshing interval is a refreshing interval of the second reserved row.

7. The method of claim 1, further comprising:
   refreshing the first reserved row and a second reserved row at same time in response to determining that the first refreshing interval and a second refreshing interval expire at the same time; wherein the second reserved row is a data row with the data storage duration greater than or equal to the preset duration in the memory, and the second refreshing interval is a refreshing interval of the second reserved row.

8. The method of claim 1, further comprising:
   refreshing a second reserved row in response to determining that the target refreshing row does not comprise the first reserved row and a second refreshing interval expires; wherein the second reserved row is a data row with the data storage duration greater than or equal to the preset duration in the memory, and the second refreshing interval is a refreshing interval of the second reserved row.

9. A controller of a memory, configured to control the memory to perform data refreshing and data access, and comprising:
   a processor; and
   a memory configured to store instructions executable by the processor;
   wherein the processor is configured to:
      determine a target refreshing row in a data row of the memory according to a running state of the controller; wherein the target refreshing row comprises at least one data row; and
      refresh a first reserved row in the target refreshing row in response to determining that a first refreshing interval expires and the target refreshing row comprises the first reserved row; wherein the first reserved row is a data row with data storage duration smaller than a preset duration in the memory, and the first refreshing interval is a refreshing interval of the first reserved row;
   wherein the memory comprises a refreshing timer, which is configured to identify whether each data row has been processed.

10. The controller of a memory of claim 9, wherein the processor is configured to determine a data row with arrived corresponding refreshing time in all the data rows of the memory to be the target refreshing row in response to determining that the running state of the controller is non-running.

11. The controller of a memory of claim 10, wherein the processor is further configured to:
acquire a fine granularity refreshing mode; wherein the fine granularity refreshing mode is a mode of grouping the data rows and sequentially refreshing groups; and
group the target refreshing row based on the fine granularity refreshing mode to acquire a plurality of refreshing groups, and sequentially refresh the plurality of refreshing groups.

12. The controller of a memory of claim 9, wherein the processor is configured to determine a data row with arrived refreshing time in part of the data rows of the memory to be the target refreshing row in response to determining that the running state of the controller is running.

13. The controller of a memory of claim 12, wherein the processor is further configured to:
acquire an intermittent refreshing mode; wherein the intermittent refreshing mode is a mode of grouping part of the data rows and refreshing each group according to a period of time; and
group the target refreshing row based on the intermittent refreshing mode to acquire a plurality of refreshing groups, and refresh the plurality of refreshing groups according to the period of time.

14. The controller of a memory of claim 9, wherein the processor is further configured to refresh a second reserved row in response to determining that a second refreshing interval expires; wherein the second reserved row is a data row with the data storage duration greater than or equal to the preset duration in the memory, and the second refreshing interval is a refreshing interval of the second reserved row.

15. The controller of a memory of claim 9, wherein the processor is further configured to refresh the first reserved row and a second reserved row at same time in response to determining that the first refreshing interval and a second refreshing interval expire at the same time; wherein the second reserved row is a data row with the data storage duration greater than or equal to the preset duration in the memory, and the second refreshing interval is a refreshing interval of the second reserved row.

16. The controller of a memory of claim 9, wherein the processor is further configured to refresh a second reserved row in response to determining that the target refreshing row does not comprise the first reserved row and a second refreshing interval expires; wherein the second reserved row is a data row with the data storage duration greater than or equal to the preset duration in the memory, and the second refreshing interval is a refreshing interval of the second reserved row.

17. A memory, comprising a controller and a plurality of storage units, each of the plurality of storage units comprising a plurality of data rows, each of the plurality of storage units being configured to store data, and the controller being configured to execute a data refreshing method of the memory, comprising:
determining a target refreshing row in a data row of the memory according to a running state of the controller; wherein the target refreshing row comprises at least one data row; and
refreshing a first reserved row in the target refreshing row in response to determining that a first refreshing interval expires and the target refreshing row comprises the first reserved row; wherein the first reserved row is a data row with data storage duration smaller than a preset duration in the memory, and the first refreshing interval is a refreshing interval of the first reserved row;
wherein the memory comprises a refreshing timer, which is configured to identify whether each data row has been processed.

18. The memory of claim 17, wherein determining the target refreshing row in the data row of the memory according to the running state of the controller comprises:
determining a data row with arrived corresponding refreshing time in all the data rows of the memory to be the target refreshing row in response to determining that the running state of the controller is non-running.

\* \* \* \* \*